US012644907B2

(12) United States Patent
Choi

(10) Patent No.: US 12,644,907 B2
(45) Date of Patent: Jun. 2, 2026

(54) AUTOMATIC WIRE CONNECTION APPARATUS FOR CIRCUIT BOARD TESTING

(71) Applicant: SAMSUNG SDI CO., LTD., Yongin-si (KR)

(72) Inventor: Imsu Choi, Yongin-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 183 days.

(21) Appl. No.: 18/379,370

(22) Filed: Oct. 12, 2023

(65) Prior Publication Data

US 2024/0329081 A1 Oct. 3, 2024

(30) Foreign Application Priority Data

Mar. 27, 2023 (KR) ........................ 10-2023-0039964
Apr. 26, 2023 (KR) ........................ 10-2023-0054967

(51) Int. Cl.
*G01R 1/067* (2006.01)

(52) U.S. Cl.
CPC ................................ *G01R 1/06722* (2013.01)

(58) Field of Classification Search
CPC ................................................ G01R 1/06722
See application file for complete search history.

(56) References Cited

U.S. PATENT DOCUMENTS

| | | | | |
|---|---|---|---|---|
| 4,528,500 | A | * | 7/1985 | Lightbody ......... H01R 13/2421 |
| | | | | 324/537 |
| 5,157,325 | A | * | 10/1992 | Murphy ............. G01R 1/07335 |
| | | | | 324/755.05 |
| 7,119,566 | B2 | | 10/2006 | Kim |
| 11,604,212 | B1 | | 3/2023 | Pichumani et al. |
| 2018/0101940 | A1 | | 4/2018 | Sohn et al. |
| 2019/0128924 | A1* | | 5/2019 | Selvaraj ............. G01R 1/06722 |
| 2020/0064372 | A1 | | 2/2020 | Arlinsky et al. |
| 2020/0393494 | A1* | | 12/2020 | Shin ................... G01R 1/06738 |

FOREIGN PATENT DOCUMENTS

| | | |
|---|---|---|
| KR | 10-1163972 B1 | 7/2012 |
| KR | 10-1934880 B1 | 11/2015 |
| KR | 10-2018-0040186 A | 4/2018 |

OTHER PUBLICATIONS

Extended European Search Report dated Jul. 9, 2024, for corresponding EP Patent Application No. 24152130.1.

* cited by examiner

*Primary Examiner* — Paresh Patel
(74) *Attorney, Agent, or Firm* — Lee IP Law, P.C.

(57) ABSTRACT

Provided is an apparatus for connecting a wire for circuit board testing to a circuit board and a circuit board verification apparatus, the apparatus including a probe configured to electrically connect a test point included in the circuit board to a wire for circuit board testing by soldering the wire to the test point, and a robot arm configured to place the probe at a preset position on the circuit board.

8 Claims, 4 Drawing Sheets

200

(a)                                    (b)

AUTOMATIC WIRE CONNECTION APPARATUS FOR CIRCUIT BOARD TESTING

CROSS-REFERENCE TO RELATED APPLICATION

This application is based on and claims priority under 35 U.S.C. § 119 to Korean Patent Application No. 10-2023-0039964, filed on Mar. 27, 2023, in the Korean Intellectual Property Office, and Korean Patent Application No. 10-2023-0054967, filed on Apr. 26, 2023, in the Korean Intellectual Property Office, the disclosures of which are incorporated by reference herein in their entireties.

BACKGROUND

1. Field

One or more embodiments relate to an automatic wire connection apparatus for circuit board testing.

2. Description of the Related Art

In firmware (FW) verification of a battery management system (BMS) circuit board, numerous test points in the BMS circuit board are soldered to wires and thus connected to an automatic verification apparatus. The number of test points is usually large, e.g., more than tens of points.

SUMMARY

According to one or more embodiments, an apparatus for connecting a wire for circuit board testing to a circuit board and a circuit board verification apparatus includes a probe configured to electrically connect a test point included in the circuit board to a wire for circuit board testing by soldering the wire to the test point, and a robot arm configured to place the probe at a preset position on the circuit board.

The probe may be further configured to shorten and lengthen in a major axis direction.

The probe includes a built-in elastic spring.

The probe may be further configured to shorten while being moved by the robot arm, and lengthen when placed at the preset position on the circuit board.

The probe may be fixed between the circuit board and a fixing board by lengthening when placed at the preset position on the circuit board.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
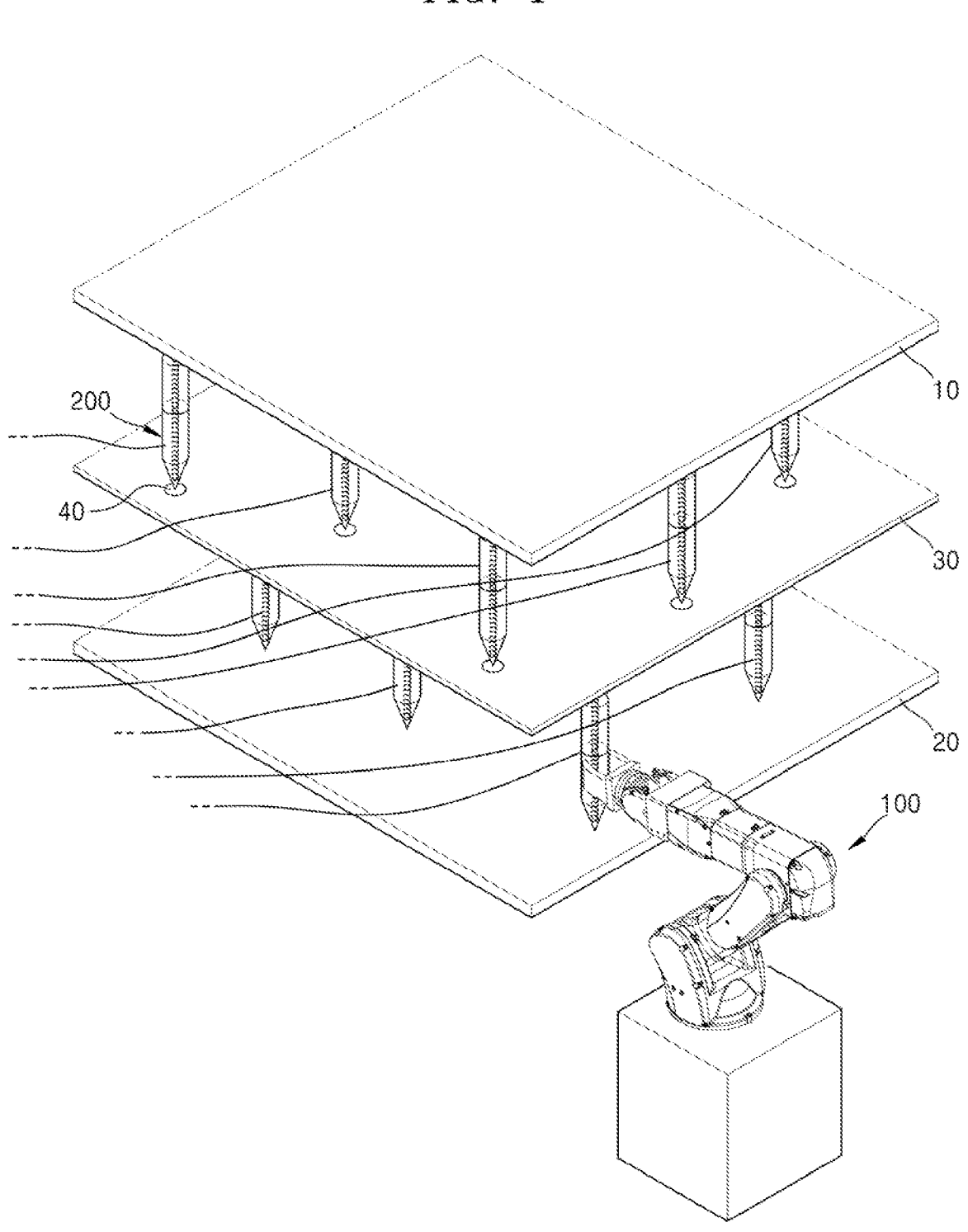
FIG. 1 is a diagram for describing a configuration and an operation of a wire connection apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items. Further, terms such as "first," "second," etc., are used only to distinguish one component from another, and such components must not be limited by these terms. In addition, a singular expression also includes the plural meaning as long as it is not inconsistent with the context. In addition, the terms "comprises," "includes," "has", and the like used herein specify the presence of stated features or components, but do not preclude the presence or addition of one or more other features or components.

Hereinafter, various embodiments will be described in detail with reference to the accompanying drawings such that those of skill in the art may easily practice the disclosure.

FIG. 1 is a diagram for describing a configuration and an operation of a wire connection apparatus according to an embodiment. The wire connection apparatus according to an embodiment may be an apparatus for connecting a wire for circuit board testing to a circuit board 30 and a circuit board verification apparatus.

Referring to FIG. 1, the wire connection apparatus according to an embodiment may include a probe 200 and a robot arm 100.

The probe 200 may electrically connect a test point 40 included in the circuit board 30 to a wire for circuit board testing by soldering them. For example, a plurality of test points 40 may be provided. In addition, the probe 200 may be electrically connected to a wire for circuit board testing. For example, referring to FIG. 1, a plurality of probes 200 according to an embodiment may be used to electrically connect the plurality of test points 40 to the circuit board verification apparatus.

The robot arm 100 may place the probe 200 at a preset position on the circuit board 30. For example, referring to FIG. 1, the robot arm 100 according to an embodiment may place the plurality of probes 200 respectively at preset positions of the plurality of test points 40 on the circuit board 30. For example, the robot arm 100 may perform an operation of holding the probe 200, an operation of moving the probe 200, an operation of releasing the probe 200, and the like.

In the wire connection apparatus according to an embodiment, the robot arm 100 may place the probe 200 connected to the wire on designated coordinates. In addition, the probe 200 may include a built-in spring and thus may vertically (e.g., along its lengthwise direction) stretch to be fixed between the circuit board 30 and an upper fixing board 10 or a lower fixing board 20. For example, referring to FIG. 1, the probe 200 may be positioned to extend, e.g., lengthwise, in a vertical direction (e.g., a direction normal to a major surface of the circuit board 30) between the circuit board 30 and an upper fixing board 10 or a lower fixing board 20.

The wire connection apparatus according to an embodiment may include the upper fixing board 10 and the lower fixing board 20 that serve to fix the probe 200 on and under the circuit board 30. For example, the circuit board 30 may be arranged between the upper fixing board 10 and the lower fixing board 20 in the vertical direction, e.g., each of the upper fixing board 10 and the lower fixing board 20 may completely overlap the circuit board 30 in the vertical direction.

The wire connection apparatus according to an embodiment may include the robot arm 100 that moves the vertically stretchable probe 200 in X-, Y-, and Z-axis directions on the circuit board 30. The probe 200 of the wire connection apparatus according to an embodiment may be locked when pressed up and down in the major axis direction, and thus, may vertically shorten to be movable. In addition, when the robot arm 100 releases the probe 200, the probe 200 may be unlocked, and thus, may vertically lengthen to be fixed between the circuit board 30 and the upper fixing board 10 or the lower fixing board 20.

The wire connection apparatus according to an embodiment may include a memory, a processor, and a communication module. However, the disclosure is not limited thereto, and the wire connection apparatus may further include other components or may omit some components. Some components of the wire connection apparatus may be separated into a plurality of apparatuses, or a plurality of components of the wire connection apparatus may be integrated into one apparatus.

The memory is a computer-readable recording medium and may include a permanent mass storage device, e.g., random-access memory (RAM), read-only memory (ROM), or a disk drive. In addition, the memory may temporarily or permanently store program code for controlling the wire connection apparatus.

The processor controls the overall operation of the wire connection apparatus. For example, the processor may be implemented in a form that selectively includes a processor known in the art, an application-specific integrated circuit (ASIC), other chipsets, a logic circuit, a register, a communication modem, and/or a data processing device, in order to perform the above-described operation. For example, the processor may perform basic arithmetic, logic, and input/output operations, and may execute, e.g., program code stored in the memory. The processor may store data in the memory or load data stored in the memory.

The processor may control an operation of the robot arm 100. For example, the processor may use the robot arm 100 to move the probe 200 to a preset (e.g., pre-stored or predetermined) position of the test point 40 of the circuit board 30, based on the preset (e.g., pre-stored) position of the test point 40.

The communication module may provide a function for communicating with an external server through a network. For example, a request generated by the processor of the wire connection apparatus according to program code stored in a recording device, e.g., a memory, may be transmitted to the external server through the network under control of the communication module. Conversely, a control signal or command, content, a file, and the like provided under control of a processor of the external device may be received by the wire connection apparatus through the communication module via the network. For example, a control signal or command received from the external server through the communication module may be delivered to the processor or the memory.

The communication method is not limited, and may include short-range wireless communication between devices, as well as a communication method utilizing a communication network that may include, e.g., a mobile communication network, wired Internet, wireless Internet, or a broadcasting network. For example, the network may include any one or more of a personal area network (PAN), a local area network (LAN), a campus area network (CAN), a metropolitan area network (MAN), a wide area network (WAN), a broadband network (BBN), an Internet network, and the like. In addition, the network may include any one or more of network topologies including, e.g., a bus network, a star network, a ring network, a mesh network, a star-bus network, a tree or hierarchical network, and the like.

In addition, the wire connection apparatus according to the disclosure may include an input/output interface. The input/output interface may be a unit for interfacing with an input device and an output device. For example, the input device may include e.g., a keyboard or mouse, and the output device may include, e.g., a display for displaying a communication session of an application. As another example, the input/output interface may be a unit for interfacing with a device in which functions for input and output are integrated, e.g., a touch screen. As a more specific example, in processing a command of a computer program loaded into the memory, the processor of the wire connection apparatus may display a service screen or content configured by using data provided by an external server, on a display through the input/output interface.

In addition, in some embodiments, the wire connection apparatus may include more components than those illustrated in FIG. 1. For example, the wire connection apparatus may be implemented to include at least some of the above-described input/output devices, or may further include other components, e.g., a battery that supplies power to internal components, a charging device, various sensors, a database, and the like.

Figure 2:
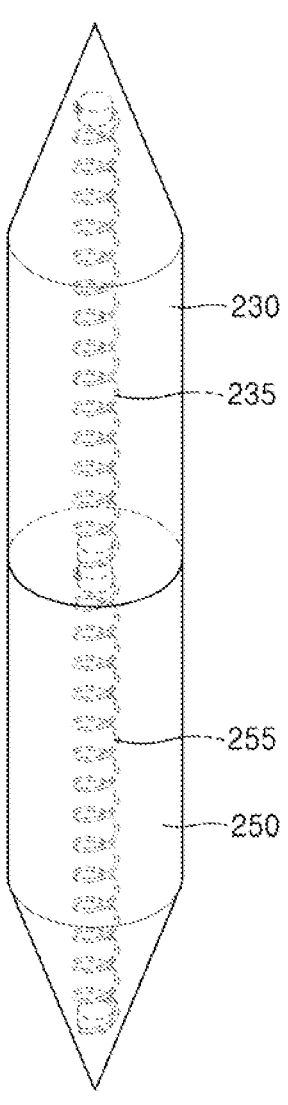
FIGS. 2 and 3 are diagrams for describing a probe according to an embodiment.
Figure 3:
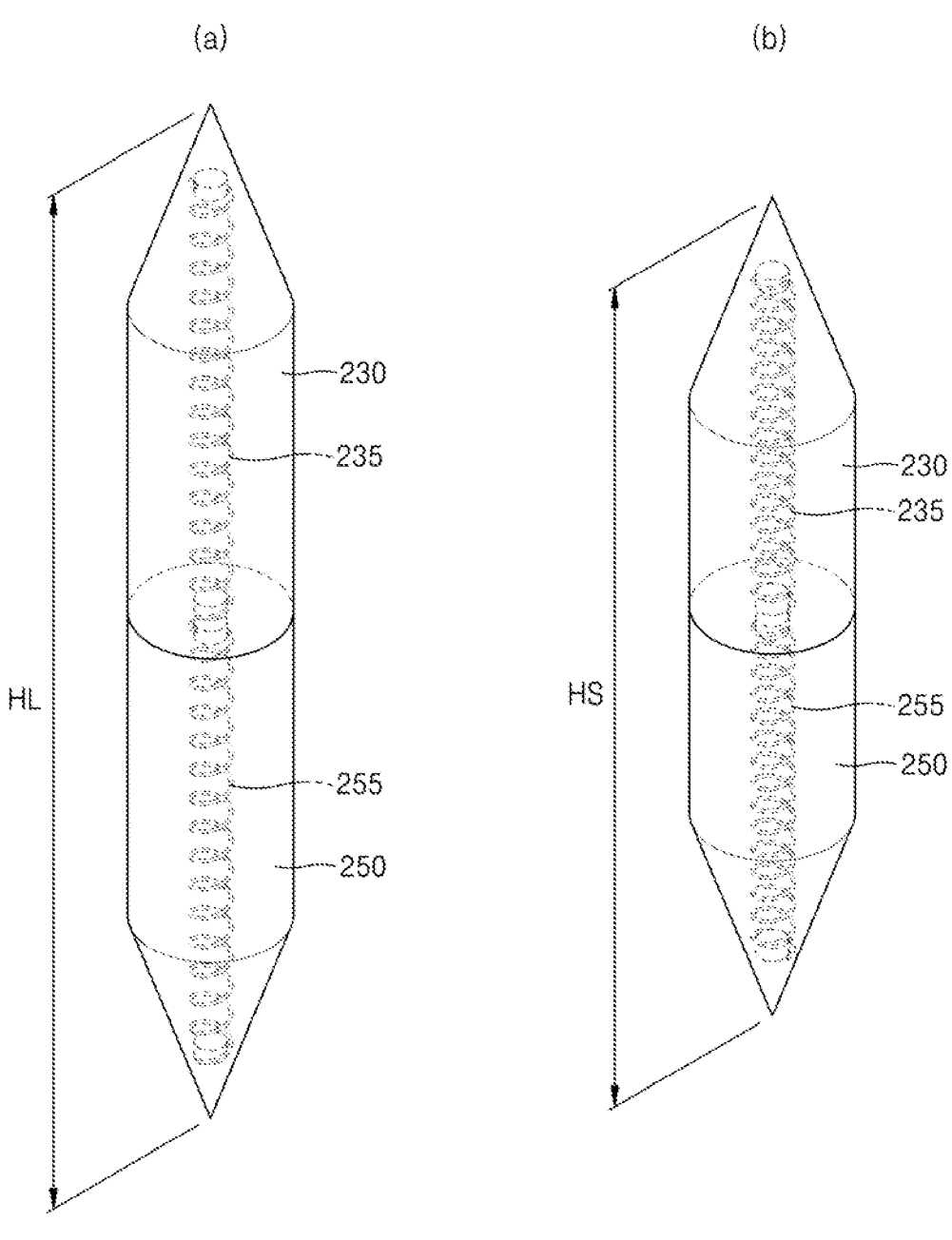

FIGS. 2 and 3 are diagrams for describing the probe 200 according to an embodiment.

Referring to FIGS. 2 and 3, the probe 200 according to an embodiment may be configured to shorten and lengthen in its major axis direction, e.g., in its lengthwise direction. In addition, the probe 200 according to an embodiment may include a built-in elastic spring. For example, referring to FIG. 2, the probe 200 may include an upper probe part 230 and a lower probe part 250. In addition, the upper probe part 230 may include an upper spring 235, and the lower probe part 250 may include a lower spring 255. However, the probe 200 may include any suitable number of parts and springs, e.g., one or more springs.

For example, referring to FIG. 2, each of the upper and lower probe parts 230 and 250 may include a flat end and a connection end (e.g., a sharp end) opposite the flat end, such that the connection end may be connected to the circuit board 30, the upper fixing board 10, or the lower fixing board 20. For example, the flat ends of the upper and lower probe parts 230 and 250 may be connected to each other, such that opposite ends of the combined structure of the upper and lower probe parts 230 and 250 (i.e., the probe 200) may be sharp and point away from each other. For example, the upper and lower springs 235 and 255 may be coaxial (e.g., vertically aligned) and may be positioned along the longitudinal directions of the upper and lower probe parts 230 and 250, respectively. For example, the combined structure of the upper and lower springs 235 and 255 may extend through a center of the probe 200 (e.g., along its longitudinal direction), thereby imparting flexibility and elasticity to the probe 200 and facilitating shortening and lengthening of the probe 200—along its longitudinal direction.

The probe 200 may shorten and lengthen in the major axis direction. For example, referring to (a) of FIG. 3, the probe 200 may lengthen in the major axis direction to have a major axis length or a major axis height of a maximum length HL. For example, referring to (b) of FIG. 3, the probe 200 may shorten in the major axis direction to have a major axis length or a major axis height of a minimum length HS.

The probe 200 according to an embodiment may be configured to shorten while being moved by the robot arm 100, and lengthen when placed at a preset position on the circuit board 30. For example, while being moved by the robot arm 100, the probe 200 may shorten to the minimum length HS to be movable. In addition, when placed at the test point 40 on the circuit board 30, the probe 200 may lengthen to the maximum length HL.

Figure 4:
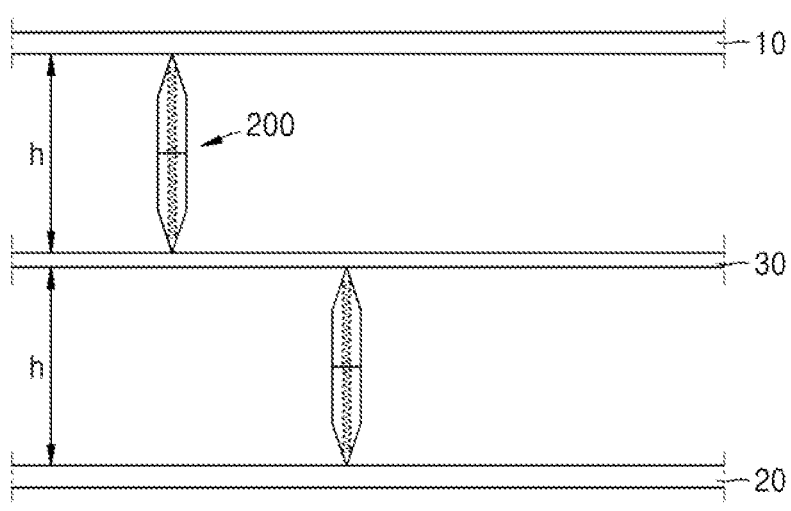
FIG. 4 is a diagram for describing an operation of a wire connection apparatus according to an embodiment.

FIG. 4 is a diagram for describing an operation of a wire connection apparatus according to an embodiment.

Referring to FIG. 4, the probe 200 according to an embodiment may be placed at a preset position on the circuit board 30, and then lengthen to be fixed between the circuit board 30 and the upper fixing board 10. For example, the probe 200 may be placed at the position of the test point 40 on the circuit board 30 and then lengthen to the maximum length HL. In this case, the probe 200 may be fixed between the circuit board 30 and the upper fixing board 10 or the lower fixing board 20.

For example, referring to FIG. 4, a length h of a space between the upper fixing board 10 and the circuit board 30, or a length h of a space between the lower fixing board 20 and the circuit board 30 may be equal to the length of the major axis of the probe 200 having lengthened to the maximum length HL, e.g., lengthening and shortening of the probe 200 may be controlled and adjusted via a controller in accordance with its contact with the robot arm 100 or the test point 40 on the circuit board 30.

According to the disclosure, wiring work for connecting a test point of a circuit board to an automatic inspection apparatus, which is performed through manual soldering in the art, may be automatically performed in a manner in which a robot arm places an elastic probe at a desired position.

| Method | Traditional manual soldering | Automated method according to Example Embodiments |
|---|---|---|
| Required time | 8 hours or longer | 30 minutes or shorter |
| Required number of workers | 1 | 0 |

The apparatus and/or system described above may be implemented as a hardware component, a software component, and/or a combination of a hardware component and a software component. The apparatus and components described in the embodiments may be implemented by using one or more general-purpose computers or special-purpose computers, e.g., a processor, a controller, an arithmetic logic unit (ALU), a digital signal processor, a microcomputer, a field-programmable gate array (FPGA), a programmable logic unit (PLU), a microprocessor, or any other device configured to execute and respond to instructions. The processor may execute an operating system (OS) and one or more software applications running on the OS. The processor may also access, store, modify, process, and generate data in response to execution of software. Although some embodiments are described, for convenience of understanding, with reference to examples in which a single processor is used, those of skill in the art would understand that a processor may include a plurality of processing elements and/or a plurality of types of processing elements. For example, the processor may include one or more processors and one controller. In addition, other processing configurations are also possible, e.g., a parallel processor.

The software may include a computer program, code, instructions, or a combination of one or more thereof, and may configure the processor to operate as desired or may independently or collectively instruct the processor. Software and/or data may be embodied permanently or temporarily in any type of machine, component, physical or virtual equipment, computer storage medium or device, or in a propagated signal wave capable of providing instructions or data to or being interpreted by the processor. The software may be distributed on networked computer systems and stored or executed in a distributed manner. The software and data may be stored in one or more computer-readable recording media.

The method according to an embodiment may be embodied as program commands executable by various computer devices, and recorded on a computer-readable medium. The computer-readable medium may include program instructions, data files, data structures, or the like separately or in combinations. The program commands to be recorded on the medium may be specifically designed and configured for an embodiment, or may be well-known to and be usable by those skilled in the art of computer software. Examples of the computer-readable recording medium may include magnetic media, e.g., hard disks, floppy disks, or magnetic tapes, optical media, e.g., a compact disc ROM (CD-ROM) or a digital video disc (DVD), magneto-optical media, e.g., a floptical, and hardware devices, e.g., ROM, RAM, or flash memory, which are specially configured to store and execute program instructions. Examples of the program instructions include not only machine code, e.g., code made by a compiler, but also high-level language code that is executable by a computer by using an interpreter or the like. The hardware device may be configured to operate as one or more software modules to perform an operation of an embodiment, and vice versa.

Although the embodiments have been described with the limited embodiments and the drawings, various modifications and changes may be made by those of skill in the art from the above description. For example, the described techniques may be performed in a different order from the described method, and/or components of the described system, structure, device, circuit, etc. may be combined or integrated in a different form from the described method, or may be replaced or substituted by other components or equivalents to achieve appropriate results.

By way of summation and review, test points in the BMS circuit board are usually soldered to wires manually, thereby requiring a lot of time and effort from a worker. In contrast, one or more embodiments include an automatic wire connection apparatus for circuit board testing.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An apparatus for connecting a wire for circuit board testing to a circuit board and a circuit board verification apparatus, the apparatus comprising:
   a probe configured to electrically connect to a test point included in the circuit board;
   a robot arm configured to place the probe at a preset position on the circuit board,
   wherein the probe includes:
      an upper probe part having a flat end and a sharp end opposite each other in a longitudinal direction of the upper probe part,
      a lower probe part having a flat end and a sharp end opposite each other in a longitudinal direction of the lower probe part, the flat end of the lower probe part being connected to the flat end of the upper probe part, and
      a spring extending from the flat end into the sharp end in each of the upper probe part and the lower probe part; and
   a controller electrically connected to the robot arm and to the test point, the controller being configured to adjust the probe to a minimum length when in the robot arm and to a maximum length when placed at the preset position on the circuit board, the preset position being the test point.

2. The apparatus as claimed in claim 1, wherein each of the upper probe part and the lower probe part is elastic from the flat end to the sharp end, each of the upper probe part and the lower probe part being configured to shorten and lengthen in its major axis direction.

3. The apparatus as claimed in claim 2, wherein the spring is a built-in elastic spring through a center of the probe.

4. The apparatus as claimed in claim 1, wherein the probe is fixed between the circuit board and a fixing board by lengthening when placed at the preset position on the circuit board.

5. The apparatus as claimed in claim 1, wherein the sharp end of each of the upper probe part and the lower probe part is integral with a respective one of the upper probe part and the lower probe part.

6. The apparatus as claimed in claim 1, wherein each of the upper probe part and the lower probe part includes a portion with a gradually narrowing width, the spring extending into the portion with the gradually narrowing width.

7. The apparatus as claimed in claim 6, wherein the portion with the gradually narrowing width has a conical structure that ends with the sharp end, the spring extending into the conical structure.

8. The apparatus as claimed in claim 1, wherein the probe is configured to lengthen when placed at the preset position on the circuit board.

* * * * *